United States Patent [19]

Zappe

[11] 4,117,503
[45] Sep. 26, 1978

[54] JOSEPHSON INTERFEROMETER STRUCTURE WHICH SUPPRESSES RESONANCES

[75] Inventor: Hans Helmut Zappe, Granite Springs, N.Y.

[73] Assignee: International Business Machines Corporation, Armonk, N.Y.

[21] Appl. No.: 811,753

[22] Filed: Jun. 30, 1977

[51] Int. Cl.² .............................. H01L 39/22
[52] U.S. Cl. .......................... 357/5; 307/306; 307/212; 331/107 S
[58] Field of Search .............. 357/5; 307/306, 212; 331/107 S

[56] References Cited

U.S. PATENT DOCUMENTS

| | | | |
|---|---|---|---|
| 3,705,393 | 12/1972 | Anacker | 340/173.1 |
| 3,879,715 | 4/1975 | Zappl | 340/173.1 |
| 3,906,538 | 9/1975 | Matisov | 357/5 |
| 3,913,120 | 10/1975 | Lahiri | 357/5 |
| 3,978,351 | 8/1976 | Zappl | 307/306 |
| 3,999,203 | 12/1976 | Lahiri | 357/5 |
| 4,012,642 | 3/1977 | Gueret | 307/212 |

OTHER PUBLICATIONS

Zappl, I.B.M. Tech. Discl. Bull., vol. 15, No. 1, Jun. 1972, p. 225.
Jutzi, I.B.M. Tech. Discl. Bull., vol. 16, No. 6, Nov. 1973, p. 2020.

Primary Examiner—Martin H. Edlow
Attorney, Agent, or Firm—Thomas J. Kilgannon, Jr.

[57] ABSTRACT

Josephson interferometers contain inductive, capacitive and resistive components, and, as a result, such devices are subject to the presence of relatively high amplitude resonances similar to those found in in-line gases. Interferometer structures exhibit the same resonant behavior as long tunnel junctions, except that there exist only as many discrete resonance voltages as meshes in the interferometer device. Hence, a two-junction interferometer has one resonance as compared to two resonances in a three-junction device. In the I-V characteristic of a Josephson tunneling device such as an interferometer, such resonances appear as current steps which must be taken into account in the design of Josephson switching circuits primarily to avoid the situation where the load line of an external load intersects a resonance peak. Where the load line and the resonance peak intersect, because such an intersection is stable, the device is prevented from switching to the full voltage desired. Such resonances can be effectively suppressed in interferometers by providing a resistance which is in parallel with the main inductance of the interferometer. In a two-junction interferometer, the resistance is effectively connected between the base electrode metallizations which are utilized to form one of the electrodes of each of the pair of electrodes required for each interferometer junction. To the extent that more than two junctions are utilized, the resonance suppressing resistor is connected between pairs of junctions and across the main inductances which interconnect the junctions. The structure of a two-junction interferometer with its resonance-suppressing resistor, $R_{RS}$, is shown as well as the schematics of a multiple junction interoferometer which clearly indicates how such structures may be fabricated.

16 Claims, 9 Drawing Figures

JOSEPHSON INTERFEROMETER STRUCTURE WHICH SUPPRESSES RESONANCES

BACKGROUND OF THE INVENTION

1. Field of the Invention

This invention relates generally to multi-junction interferometer devices which are to be used in high-speed logic circuits. It further relates to symmetrically fed, multi-function interferometers wherein resonances occur due to the interaction between the Josephson junction capacitances and an inductance which interconnects them. Still more specifically, it relates to interferometer structures in which the number of resonant peaks present is determined by the number of meshes in the interferometer device. In a preferred embodiment, a two-junction interferometer has a single mesh formed by the pair of junctions interconnected by a main inductance and a small value of stray inductance. To achieve suppression of current resonance peaks in the device which is intended to operate in a below the gap regime, a low inductance resistance is disposed so that it effectively shunts the main inductance of the device.

In other embodiments, where multiple meshes are formed by pairs of junctions and their connecting main inductances, each of the latter is similarly shunted by a low inductance resistance which effectively suppresses the current resonance peaks to insure that the interferometer switches to the desired below-the-gap voltage.

2. Description of the Prior Art

U.S. Pat. No. 3,906,538, Ser. No. 422,960, filed Dec. 7, 1973 entitled "Techniques for Minimizing Resonance Amplitudes of Josephson Junctions" and assigned to the same assignee as the present invention, deals with resonant conditions in a single rectangular Josephson junction. The preferred embodiment reduces the resonant conditions by shaping the junction so it is no longer rectangular. The patent does not specifically deal with resonances in multijunction interferometers. The teaching cannot be extended to the suppression of macroscopic resonances in multijunction interferometers.

U.S. Pat. No. 3,879,715, Ser. No. 429,412, filed Dec. 28, 1973 entitled "Damped Josephson Junction Memory Cell with Inductively Coupled Resistive Loop" deals with the damping of memory cells for effective operation by inductively coupling a resistive loop to the memory cell. The inductively coupled resistor effectively reduces the junction resistance, $R_j$, from a relatively high value to a lower value. Apart from the fact that this patent does not deal with multiple junction interferometers, the expedient of inductively coupling a resistor to an interferometer would not suppress resonances in multi-junction devices because an effective series inductance would be provided which would not allow effective suppression of resonances.

U.S. Pat. Nos. 3,705,393, Ser. No. 51,057, filed June 30, 1970 entitled "Superconducting Memory Array Using Weak Links" deals with memory cells formed of a superconducting ring and a weak link interposed therein. The patent indicates at Col. 3, lines 21–33: "If the capacitance of the Josephson device is too high, there will be oscillation of the energy stored in the capacitance between the electric field associated with the capacitance and the magnetic field associated with the inductance of the superconducting loop."

"In order to reduce these oscillations, the capacitance of the loop must be small and there must be damping associated with the Josephson device. The damping is related to the geometry of the Josephson device and, if required, a bridge between the superconducting elements of the device can be provided to affect damping."

At col. 7, lines 14–20, the oscillations are controlled as follows: "The damping is a function of the Josephson device and can be somewhat controlled by adding resistive material to the Josephson barrier or by bridging the Josephson Junction. For instance, it is possible to create a metal bridge across the Josephson barrier to influence the resistance of the junction."

The above approach effectively increases damping by decreasing $R_j$. While the oscillations referred to are not of the same character as macroscopic resonances, even if one were to apply the teachings of this patent to interferometer logic circuits to provide low junction resistances, $R_j$, therein, the resulting device would not be effective as a logic circuit because insufficient current would be diverted to an associated load to permit operation as a logic device.

IBM Technical Disclosure Bulletin, Vol. 16, No. 6, Nov. 1973, p. 2020, in an article entitled "Josephson-Junction with Negligible Hysteresis" by W. W. Jutzi, the author indicates that resonances generated with a control field can seriously limit the voltage swing across the junction of logic circuits. He indicates that resonances can be avoided by loading the junction with ohmic resistance. This is accomplished by forming confined zones of normal conductivity in the superconducting electrodes of a Josephson junction. This article does not deal with multi-junction devices, and to the extent the teaching thereof could be extended to multi-junction devices, one would be led to resistively load each junction electrode in the same manner as shown, thereby reducing the output current and rendering such devices ineffective as logic devices.

U.S. Pat. No. 3,676,718, Ser. No. 128,445, filed Mar. 26, 1971, entitled "Supercurrent Structures Utilizing Mobil Flux Vortices" in FIG. 5 thereof shows a structure similar to the interferometers utilized in the present application. While two junctions are shown, the structure is not an interferometer and loop 40 is utilized to form a "hole" which creates a preferred vortex location. In addition, the device is not properly symmetrically current fed nor does it incorporate or even concern itself with the use of a resistance across the main inductance thereof to suppress resonances.

SUMMARY OF THE INVENTION

In accordance with the broadest aspect of the present invention, an interferometer is provided which includes at least a pair of junctions capable of carrying Josephson current and at least a main inductance disposed between the pair of junctions. In addition, means are disposed in parallel with the main inductance for suppressing resonance peaks.

In accordance with the broader aspect of the present invention, the means for suppressing includes a resistor of value sufficient to suppress the resonance peaks.

In accordance with more specific aspects of the present invention, the interferometer further includes an input connection symmetrically connected to the main inductance.

In accordance with still more specific aspcets of the present invention, the interferometer further includes a control line disposed in electromagnetically coupled relationship with the main inductance and still further includes a load impedance connected across the interferometer structure.

In accordance with the broader aspects of the present invention, an interferometer is provided which includes first, second, and third junctions capable of carrying Josephson current and first and second main inductances connected between the first and second junctions and the second and third junctions respectively. Also included is means disposed in parallel with said first and second main inductances for suppressing resonance peaks.

In accordance with still more specific aspects of the present invention, an interferometer is provided wherein the means for suppressing includes a resistor of value sufficient to suppress the resonance peaks and still further includes an input current connection symmetrically connected to the first and second main inductances.

It is, therefore, an object of this invention to provide a multi-junction interferometer which is substantially free from the presence of current resonance peaks.

Another object is to provide a Josephson junction interferometer which is capable of operating at a desired below-the-gap voltage.

Still another object is to provide symmetrically fed, multi-junction interferometers which are capable of operation in high-speed logic circuits.

Yet another object is to provide an interferometer structure in which the means for suppressing resonance peaks requires minimum substrate area and has very low inductance.

The foregoing and other objects, features and advantages of the invention will become apparent from the following more particular description of the preferred embodiment of the invention as illustrated in the accompanying drawings.

BRIEF DESCRIPTION OF THE DRAWINGS

FIG. 4 also shows a schematic of a Resonance-Suppressing Resistor $R_{RS}$ shunting the main inductance of the interferometer mesh.

DESCRIPTION OF THE PREFERRED EMBODIMENTS

Figure 1:
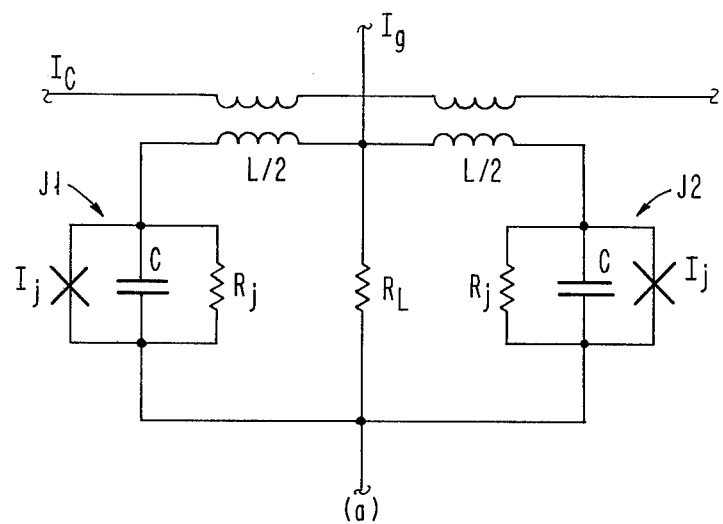
FIG. 1 is a schematic diagram of a symmetric, center-fed two junction interferometer. The Josephson junctions are represented by a capacitance, a tunnel resistance and a zero field Josephson threshold current $I_j = I_o$. An external load, $R_L$, is connected across the device. Currents $I_g$ and $I_C$ are the gate and control currents, respectively, the latter being applied by a control line coupled to a pair of inductances each of value L/2 both of which constitute the total inductance of the interferometer.

Referring now to FIG. 1, there is shown therein a schematic diagram of a symmetric, center-fed two-junction interferometer. The Josephson junctions J1, J2 are represented by a capacitance, C, a tunnel resistance, R, and a zero field Josephson threshold current, $I_j = I_o$. An external load, $R_L$, is shown connected across the device. Currents $I_g$ and $I_C$ are the gate and control currents, respectively. The latter is applied by a control line coupled to a pair of inductances each of value L/2 both of which constitute the total inductance of the interferometer.

A Josephson device held at a voltage V produces an internal current alternating at a fundamental frequency $f_j = 2eV/h$ and it is well known that under these conditions, a d.c. current component can be produced by the nonlinear interaction between the device and an external electromagnetic wave of the same frequency. Self-induced d.c. components occur in structures in which the Josephson device is coupled to a resonator. The resonator, when excited by the a.c. Josephson current, reflects energy back onto the device producing d.c. current components at voltages corresponding to the resonance frequencies of the structure. In the I-V characteristic of Josephson tunnel junctions, such resonances appear as current steps which must be taken into account in the design of Josephson switching circuits, primarily to avoid the situation where the load line of an external load intersects a resonant step. Unless such a situation is avoided, the device is prevented from switching to the full desired voltage inasmuch as such an intersection is a stable intersection.

Recently, quantum interference devices similar to that shown in U.S. Pat. No. 3,978,351, Ser. No. 592,000, filed June 30, 1975 and issued August 31, 1976 and assigned to the same assignee as the present invention have been proposed as logic devices. Such structures exhibit the same resonant behavior as long-tunnel junctions except that there exists only as many discrete resonance voltages as meshes in the device. Thus, a two-junction interferometer, the equivalent circuit of which is shown in FIG. 1, has only one resonance whereas there are multiresonances developed in three, four and five-junction devices. There is, however, no necessity for considering such multijunction interferometers inasmuch as the two-junction interferometer of FIG. 1 is the simplest structure that needs to be considered because its resonant behavior is pertinent to that of multijunction interferometers having three or more junctions. For example, each resonance in a three-junction interferometer similar to that shown in FIG. 3B of the above-mentioned U.S. Pat. No. 3,978,351 can, to the first order, be treated as a two-junction device resonance. One resonance is an oscillation between the two outer junctions with the center junction situated basically at a voltage node while the other, occurring at a higher frequency, corresponds to oscillation in the two meshes between the side junctions, both in phase so that the device behaves as if composed of two resonating two-junction interferometers connected in parallel. The two main resonances are illustrated schematically in FIGS. 2A, 2B.

Figure 2A:
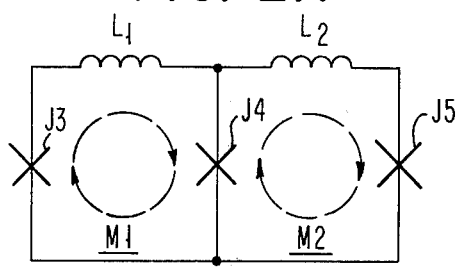
FIG. 2A is a schematic diagram of a three-junction interferometer showing one of the two resonance modes which exist in such interferometers.
Figure 2B:
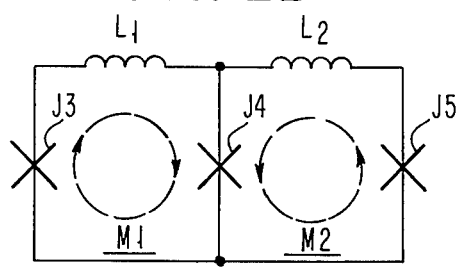
FIG. 2B is a schematic diagram of the three-junction interferometer of FIG. 2A showing the other of the two resonance modes which exist in such interferometers.

Referring now to FIG. 2A, there is shown a schematic diagram of a three-junction interferometer wherein three-junctions J3, J4, J5 are connected in parallel. An inductance L1 is connected between devices J3, J4 forming a mesh M1 while an inductance $L_2$ is connected between junctions J4, J5 forming a mesh M2. One of the above-mentioned resonances is illustrated by the dashed lines in meshes M1, M2 which have a clockwise direction. FIG. 2B is similar to FIG. 2A and contains the same elements except that the second of the above-mentioned resonances is illustrated by a clockwise directed dashed line in mesh M1 and by a counterclockwise directed dashed line in mesh M2. The interaction between these oscillations and the circuit produces the resonances shown in FIG. 2C.

Figure 2C:
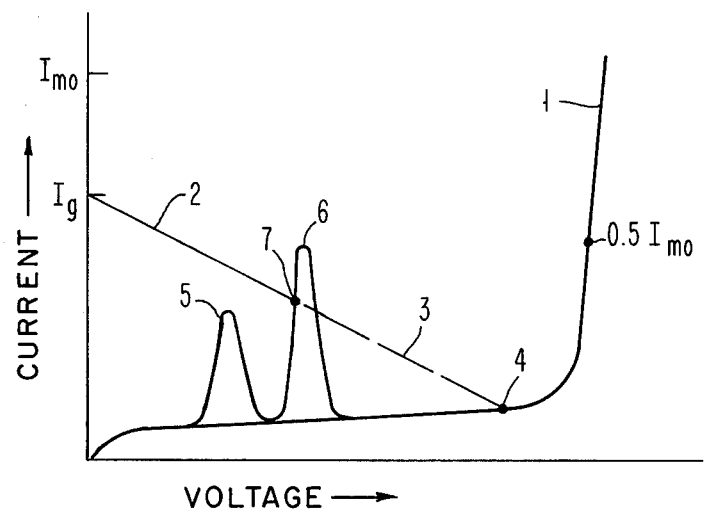
FIG. 2C is a graphical illustration of the I-V characteristic of a three-junction interferometer showing resonance current peaks, the presence of which prevents switching to the voltage determined by a load line.

Referring now to FIG. 2C, there is shown a graphical representation of the I-V characteristic of a three-junction interferometer showing resonance current peaks; the presence of which prevents switching to the voltage determined by a load line. In FIG. 2C, the I-V characteristic is shown at 1. A load line 2 has a dashed portion 3 which would normally intersect load line 1 at point 4; a value of voltage somewhat below the gap voltage of the three-junction interferometer schematically shown in FIGS. 2A, 2B. Load line 2, however, intersects the second of a pair of current resonance peaks 5, 6 at point 7. Since point 7 is a stable point, a voltage considerably less than that which would be provided if the load line could intersect characteristic 1 at point 4 is provided. To the extent that the current resonance amplitudes 5,6 in an ideal device can be of the order of 0.5 $I_{mo}$, operation of logic circuits incorporating multi-junction interferometers with load lines intersecting the below gap voltge, depending on where the resonances are, either limits device operating margins or makes certain applications impossible. However, resistances which provide load lines which are intended to intersect the I-V characteristic below the gap voltage are often required for interferometer devices. The teaching of the present application permits such load lines to be utilized by suppressing the resonance peaks 5,6 of FIG. 2C in a manner to be described hereinbelow.

Figure 3:
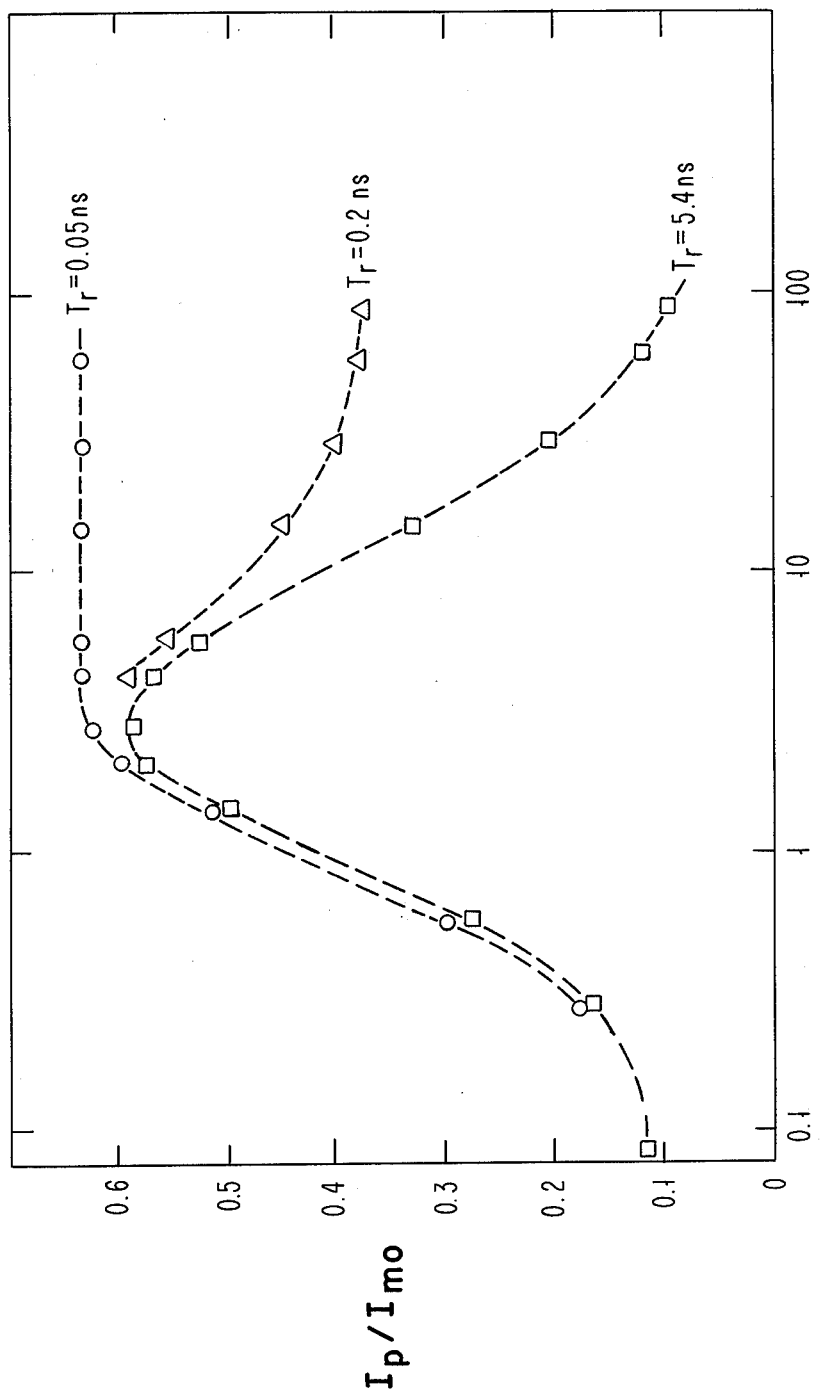
FIG. 3 is a graphical representation of the Peak Amplitudes of Resonance Current, $I_p/I_{mo}$, versus the Damping factor $\Gamma$ for different rise times of the device current.
Figure 4:
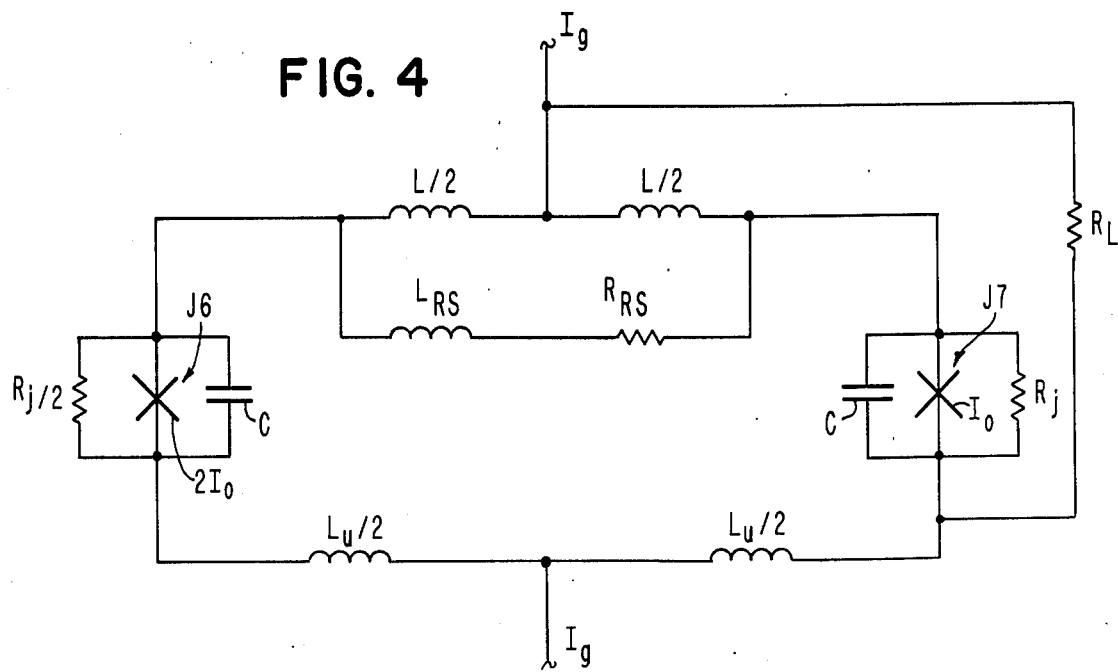
FIG. 4 is a schematic diagram of the equivalent circuit of a symmetric, center-fed, two-junction interferometer which is basically one mesh of a prior art symmetrical, dual-feed interferometer, one junction of which carries twice the maximum current of the other junction.

As indicated previously, the number of resonance peaks is a function of the number of meshes in the interferometer being utilized and, based upon a number of analytical considerations, it has been recognized that symmetric, three-junction split-feed interferometers have multi-resonances each of which can be reduced to an effective two-junction interferometer resonance similar to that which would be provided by the circuit of FIG. 1. Considering again the circuit of FIG. 1, it was recognized that in order to transfer nearly all the gate current, $I_g$, to load $R_L$, a large value of $R_j$ would be necessary. It was also recognized that in order to suppress resonances of the character discussed hereinabove, $R_j$ should be small to provide a large amount of damping. One is thus faced with a dilemma because, to achieve maximum transfer of current to the load, the value of $R_j$ should be large, but, at the same time, to suppress resonances the value of $R_j$ should be small to provide large damping. However, $R_j$, is not the only factor which determines the presence of resonances. The latter are determined by a damping factor, $\Gamma$, which includes a number of parameters and is the single most important parameter which determines resonance amplitudes.

$$\Gamma = 2\pi I_o R_j \sqrt{LC}/2$$

wherein
 $\Gamma$ = Damping Factor
 $I_o$ = zero field threshold current of an outermost junction
 $R_j$ = junction resistance below the gap voltage
 L = inductance interconnecting pairs of junctions
 C = junction capacitance of an outer junction To further complicate the picture, it was analytically determined that, in high Q interferometers, the resonance amplitude is very sensitive to the rate of change of device current $I_g$ increasing as $dI_g/dt$ increases. This is clearly seen by referring to FIG. 3 which is a graphical representation of the Peak Amplitudes of Resonance Current, $I_p/I_{mo}$, versus Damping Factor $\Gamma$ with rise times, Tr, of the device current $I_g$ as a parameter. The curves of FIG. 3 were obtained from computer simulations which were utilized to verify the results suggested by an analytical mathematical analysis of the interferometer represented schematically in FIG. 1. Results were obtained for widely varying rise times of the applied current, $I_g$. The results obtained show that for heavily damped devices, (low $\Gamma$) the Peak Amplitudes of Resonance Current, $I_p/I_{mo}$, is only weakly dependent on the rise time of the device current which was varied from $T_R = 0.05$ neno secs. to 5.4 nano secs. For $\Gamma > 3$, the rise time dependence becomes pronounced and clearly indicates that, for resonable rise times expected to be used in the Josephson environment, high values of $\Gamma$ and consequently high values of device resistance $R_j$ cannot be utilized. The results of the simulation clearly indicate that although $R_j$ should be large to transfer all the current to a circuit load, it cannot be large, since operation is such a regime would produce, in applications in which $I_C$ is applied before $I_g$ and with reasonable rise times, rather large peak amplitudes of resonance current. Thus, though the results of the simulation suggest that $R_j$ should be small to suppress resonances, a further consideration of FIG. 3 shows that additional damping causes the resonance current amplitudes to decrease. In the range of $\Gamma \leq 3$, the resonance steps widen and are essentially independent of dynamic effects like those experienced in the range $\Gamma \geq 3$. Though the resonance amplitudes in the lower range are substantially independent of dynamic effects, they still have non-zero value as shown by the curves in FIG. 3 and the value of resistance dictated would undesirably take current from an associated load. Thus, the dilemma referred to hereinabove still remains to the extent that neither high nor low values of $R_j$ will produce the desired result. This same analysis, however, led to the recognition that current steps in quantum interference devices, in general, are produced by the same mechanism which causes resonance in long Josephson junctions except that the modulation of the Josephson current in quantum interference devices is the result of macroscopic resonances between device inductances and junction capacitances. This becomes clear from a reconsideration of FIGS. 2A-2C where for a three-junction interferometer, two meshes exist which produce two resonances of amplitude sufficient to prevent the switching of the device to a desired subgap voltage. At this point, it was concluded that the resonances stemmed from the interaction between the inductances L/2 shown in FIG. 1, the sum of which constitute the main inductance of a two-junction interferometer and the junction capacitances. It was then recognized that to the extent that current was to be delivered to a load, this current was substantially d.c. in character and would not be interfered with by the presence of the device inductance. In a similar vein, it was appreciated that if the device main inductance were shunted by a resistance, any a.c. components would be suppressed and dissipated in the shunting resistor without affecting d.c. behavior. What has been effectively accomplished is that, from a d.c. point of view, a preferred path to the interferometer load has been provided via the main inductance, L, while, from an a.c. point of view, an effective reduction in $R_j$ occurs which increases damping the amplitudes of the resonances in the circuit. Such a resistance must be of low inductance because too large an $L_{RS}$ would overcome the resonance-suppressing effect of the resistance shunting the main inductance of the quantum interference device. FIG. 4 shows a schematic of one mesh of a multi-junction interferometer which includes a resonance-suppressing resistor and its inductance shunting the main inductance.

Referring to FIG. 4 in more detail, FIG. 4 is a schematic diagram of the equivalent circuit of a symmetric, center-fed, two-junction interferometer which is basically one mesh of a prior art symmetrical, dual-feed interferometer, one junction of which carries twice the maximum current of the other junction. When junctions J6, J7 are switched by the application of a control current, $I_C$, via a control line (not shown), the applied gate current $I_g$ is diverted to output load $R_L$. Where previously a resonant current peak would arise as a result of macroscopic resonances between the device inductance, L, and the capacitances C, the presence of resonance-suppressing resistor $R_{RS}$ shunting the main inductances of the device substantially suppresses the current resonance peak. In FIG. 4, the inducatance $L_{RS}$ is the inductance of resonance-suppressing resistor $R_{RS}$ and this inductance should have a small value in order not to overcome the effects of resistor $R_{RS}$. In addition to the main inductances, L/2, shown in FIG. 4, a stray inductance, $L_u$ is shown interconnecting devices J6, J7. The stray inductance is, of course, generally very much smaller than the main inductance and, as will be seen hereinafter in FIG. 5, includes the inductance of the region above the resonance suppressing resistor 12 and below the device counter electrode 16. Load impedance, $R_L$, may be a resistor which can have values of resistance sufficient to make the associated interferometer self-resetting or latching.

Figure 5:
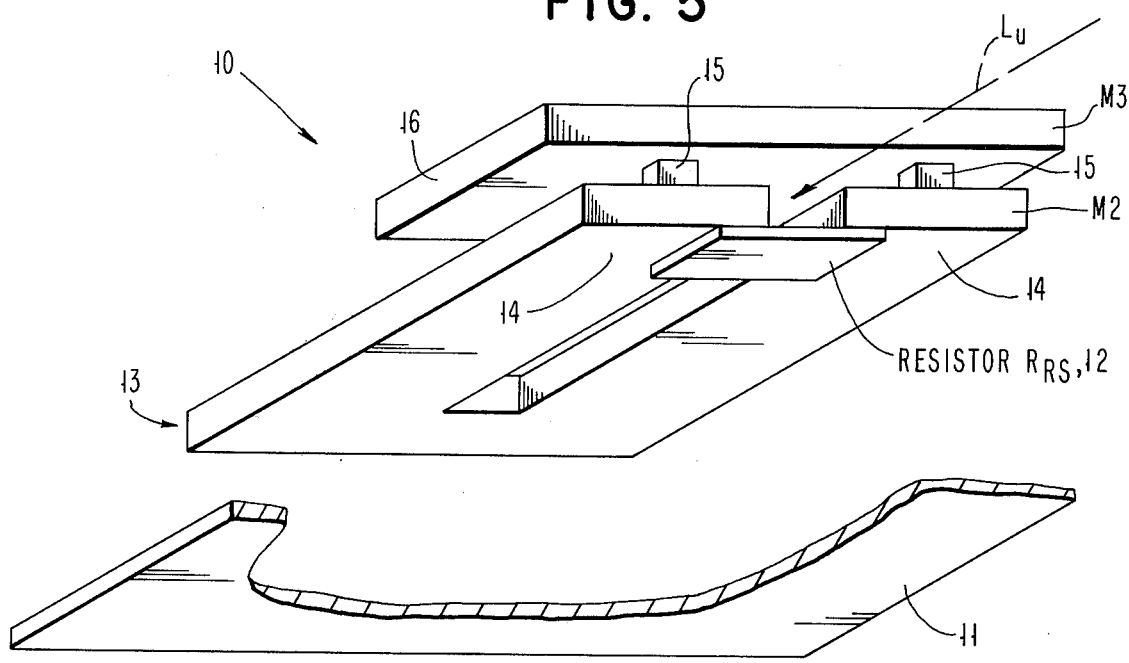
FIG. 5 shows a partially cut away, partially schematic, perspective representation of a center-fed planar two-junction interferometer structure similar to that shown schematically in FIG. 4. A Resonance-Suppressing Resistor is shown shunting the main inductance of the device and connected between what are basically the base electrodes of the interferometer junctions.

Referring now to FIG. 5, there is shown therein a partially cut-away, partially schematic, perspective representation of a center-fed, two-junction interferometer structure similar to that schematically in FIG. 4. A resonance suppressing resistor is shown shunting the main inductance of the device and connected between what are basically the base electrodes of the interferometer junctions.

Referring to FIG. 5 in more detail, a planar, two-junction interferometer 10 is shown in a partially cut-away perspective view. Interferometer 10 is shown disposed over a ground plane 11 of superconducting material such as niobium. A thin layer of oxide (not shown) such as niobium oxide ($Nb_2O_5$) and/or silicon oxide (SiO) separates ground plane 11 from the next layer which, in the instance of the present application, is a layer of metal which is normally conductive at the operating temperature of device 10. A material which fulfills this criterion is shown in U.S. Pat. No. 3,913,120, Ser. No. 429,461, filed Dec. 28, 1973 and assigned to the same assignee as that of the present application and may be a multi-component solid solution or intermetallic compound which is present as a stable phase in an associated superconductive line. The resistive material may consist of the compound AuIn or $AuIn_2$. Resistor 12 in FIG. 5 otherwise identified therein as resistor $R_{RS}$ is formed by the sequential deposition of layers of indium and gold. Resistor 12 is then delineated utilizing a well-known photolithographic stencil process. After resistor 12 is formed, a metal layer of superconducting material is delineated which, using another photolithographic stencil process, forms the main inductance 13, end portions of which contact resistor 12 and simultaneously form the base electrodes 14 of junctions to be subsequently formed. Main inductance 13 and base electrodes 14 may be formed of a ternary compound of lead-indium-gold similar to that described in the last-mentioned patent. In subsequent steps, an oxide layer such as silicon dioxide is deposited to space base electrodes 14 from a counterelectrode which is to be subsequently deposited. This layer is not shown in FIG. 5 to more clearly indicate the presence of thin tunneling oxide regions 15 which are disposed on base electrodes 14. A typical fabrication technique for forming the oxide layer is shown in U.S. Pat. No. 3,849,276, Ser. No. 125,993, filed Mar. 19, 1971. After thin oxide regions 15 are formed, a layer of superconducting metal of material similar to that which forms main inductance 13 is deposited and delineated to form counterelectrode 16. In structures such as interferometer 10, at least one control line is disposed in insulated spaced relationship with counterelectrode 16 by means of an oxide layer. However, these have not been shown inasmuch as their structure, use and fabrication is well-known to those skilled in the Josephson interferometer art. Also, the gate current feed lines to base electrodes 14 and counterelectrode 16 have not been shown. In center-fed, two-junction interferometers of the character being described in connection with FIG. 5, gate current would normally be applied symmetrically to main inductance 13 at the end thereof opposite base electrodes 14. Gate current may be removed from counterelectrode 16 in any convenient manner. The interconnection for gate current would normally be delineated at the same time counterelectrode 16 is delineated and would be made of the same material. In FIG. 5, resistor 12 spans the gap between base electrode portions 14 and shunts main inductance 13. Because resistor 12 is of the smallest possible length, it has little self-inductance and does not interfere with the major function of resistor 12; that of suppressing current resonance peaks. From FIG. 5, it should be clear that interferometers having more than two junctions can be fabricated by following the teachings discussed in connection with FIG. 5. Additional main inductances 13 and base and counterelectrodes 14, 16, respectively, are easily added to form, for example, the three-junction interferometer schematically shown in FIG. 6 of the present application.

Figure 6:
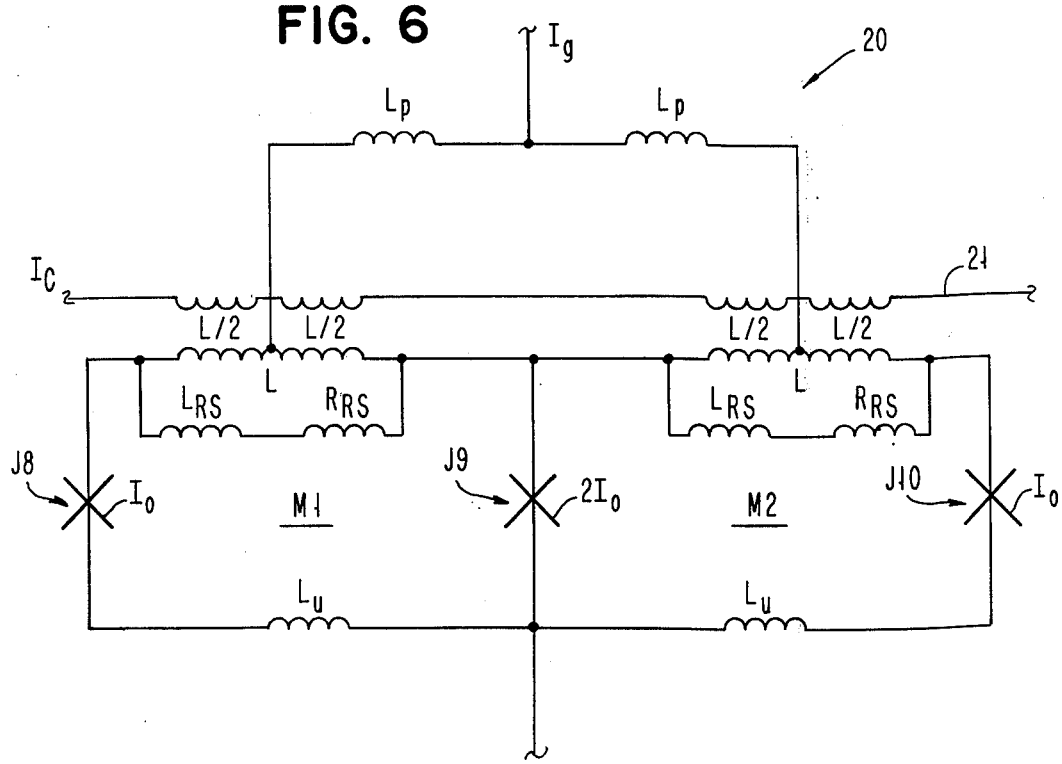
FIG. 6 shows a schematic of another embodiment of a multiple junction interferometer which incorporates three junctions and is symmetrically fed. Each of the main inductances of each mesh is shown shunted by a Resonance-Suppressing Resistor, $R_{RS}$.

Referring now to FIG. 6, there is shown a schematic of another embodiment of a multiple junction interferometer similar to that shown in FIG. 3B of U.S. Pat. No. 3,978,351 which incorporates three-junctions and is symmetrically fed. Each of the main inductances, L, of each mesh is shown shunted by a resonance-suppressing resistor, $R_{RS}$. Interferometer 20 includes three junctions J8–J10, each pair of which with an associated main inductance L forms two meshes, M1–M2. Gate current, $I_g$, is symmetrically fed to the left and right-most meshes so that the main inductance is split into two inductances each of value L/2. The center junction J9 is designed to carry the current $2I_o$ as opposed to junctions J8,J10 which are designed to carry the current $I_o$. Control current, $I_C$, is fed by a control line 21 which is disposed in electromagnetically coupled relationship with each of the main inductances of interferometer 20. In a manner similar to that shown in connection with FIG. 4, each of the main inductances L is shunted by a resonance-suppressing resistor $R_{RS}$. The inductance $L_{RS}$ of resistor $R_{RS}$ is shown schematically disposed in series with the latter and must be of very small value so as not to interfere with the function of resistor $R_{RS}$. Interferometer 20 can be fabricated in a manner similar to that described in connection with FIG. 5 and, from FIG. 6, it should be clear that interferometers with any number of meshes desired can be fabricated which incorporate the basic structure shown in FIG. 5.

Figure 7:
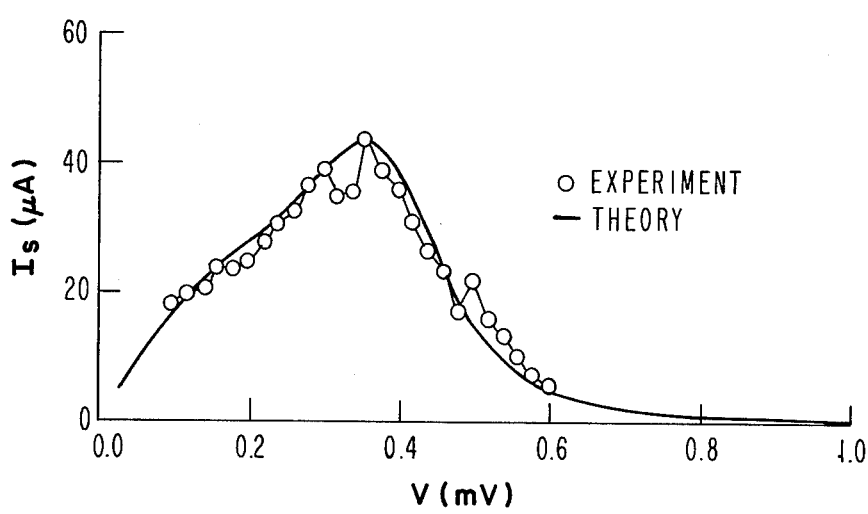
FIG. 7 is a graphical representation of the Resonance Current, $I_S$, versus voltage in a two-junction interferometer similar to that shown in FIGS. 4, 5 which shows the experimental confirmation of what was theoretically predicted. $I_S$ is related to the value $I_p$ of FIG. 3 in that $I_p$ is the peak value of $I_S$.

Typical values for the various portions of FIGS. 4,5 are as follows:

$I_g$ = 200 μamps
Main Inductance 13 = 6 picohenries
Stray Inductance $L_u$ = 0.75 picohenries
$R_{RS}12$ = 2 ohms
$R_j$ = 300 ohms Referring now to FIG. 7, there is shown a graphical representation of the Resonance Current, $I_S$, versus voltage in a two-junction interferometer similar to that shown in FIGS. 4,5 which clearly confirms experimentally what theoretical considerations predicted. The heavy line curve shows what was theoretically predicted, while the light line curve shows the values of Resonance Current, $I_S$, obtained using a two-junction interferometer having the following parameters:

$I_o$ = 85μA
L = 3.3 ph
$R_{RS}$ = 1.66 ohms
$L_u$ = 0.75 ph
C = 0.8 pF

The resulting resonance current is far below that obtained when resonance suppressing resistor, $R_{RS}$, is not utilized. The use of $R_{RS}$ clearly makes feasible the operation of interferometers as logic devices in the sub-gap region of the I-V characterics of multi-junction interferometers.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An interferometer comprising:
   at least a pair of junctions capable of carrying Josephson current and at least a main inductance disposed between said at least a pair of junctions, and,
   means disposed in parallel with said main inductance for suppressing resonance peaks.

2. An interferometer according to claim 1 wherein said means for suppressing includes a resistor of value sufficient to suppress said resonance peaks.

3. An interferometer according to claim 1 further including an input connection symmetrically connected to said at least a main inductance.

4. An interferometer according to claim 1 further including a control line disposed in electromagnetically coupled relationship with said at least a main inductance.

5. An interferometer according to claim 1 further including a load impedance connected across said interferometer.

6. An interferometer according to claim 2 wherein said resistor is a conductive material which is normally conducting near 4.2° K.

7. An interferometer according to claim 5 wherein said load impedance is a resistor of value sufficient to make said interferometer self-resetting.

8. An interferometer according to claim 5 wherein said load impedance is a resistor of values sufficient to make said interferometer latching.

9. An interferometer comprising:
   first, second and third junctions capable of carrying Josephson current and first and second main inductances connected between said first and second junctions and said second and third junctions, respectively, and,
   means disposed in parallel with said first and second main inductances for suppressing resonance peaks.

10. An interferometer according to claim 9 wherein said means for suppressing includes a resistor of value sufficient to suppress said resonance peaks.

11. An interferometer according to claim 9 further including an input current connection symmetrically connected to said first and second main inductances.

12. An interferometer according to claim 9 further including a control line disposed in electromagnetically coupled relationship with said first and second main inductances.

13. An interferometer according to claim 9 further including a load impedance connected across said interferometer.

14. An interformeter according to claim 10 wherein said resistor is a conductive material which is normally conducting near 4.2° K.

15. An interferometer according to claim 13 wherein said load impedance is a resistor of value sufficient to make said interferometer self-resetting.

16. An interferometer according to claim 13 wherein said load impedance is a resistor of value sufficient to make said interferometer latching.

* * * * *